United States Patent
Liu et al.

(10) Patent No.: US 10,175,570 B2
(45) Date of Patent: Jan. 8, 2019

(54) RETICLE AND FABRICATION METHOD THEREOF, AND METHOD FOR FABRICATING PATTERNS ON A SUBSTRATE

(71) Applicants: Xiamen Tianma Micro-electronics Co., Ltd., Xiamen (CN); Tianma Micro-electronics Co., Ltd., Shenzhen (CN)

(72) Inventors: Xiaomin Liu, Xiamen (CN); Long Zhang, Xiamen (CN); Ting Zhou, Xiamen (CN); Poping Shen, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/044,555

(22) Filed: Feb. 16, 2016

(65) Prior Publication Data
US 2016/0238927 A1   Aug. 18, 2016

(30) Foreign Application Priority Data
Feb. 13, 2015   (CN) .......................... 2015 1 0078816

(51) Int. Cl.
| | | |
|---|---|---|
| *G03F 1/50* | (2012.01) |
| *H01L 21/027* | (2006.01) |
| *G03F 1/76* | (2012.01) |
| *G03F 7/20* | (2006.01) |
| *G03F 7/32* | (2006.01) |

(52) U.S. Cl.
CPC .................. *G03F 1/50* (2013.01); *G03F 1/76* (2013.01); *G03F 7/20* (2013.01); *G03F 7/32* (2013.01); *H01L 21/0274* (2013.01)

(58) Field of Classification Search
CPC .... H01L 21/0274; H01L 21/0271; G03F 1/56
USPC .......................................................... 430/5
See application file for complete search history.

(56) References Cited

U.S. PATENT DOCUMENTS

| | | | | |
|---|---|---|---|---|
| 2006/0232860 A1* | 10/2006 | Kozenkov | ............ | G02B 5/3033 359/487.02 |
| 2013/0083276 A1* | 4/2013 | Iwahashi | ................ | B41M 3/06 349/117 |
| 2014/0038089 A1* | 2/2014 | Bae | ........................ | G03F 1/00 430/5 |

FOREIGN PATENT DOCUMENTS

| | | |
|---|---|---|
| CN | 1339715 A | 3/2002 |
| CN | 101576709 A | 11/2009 |
| CN | 103309073 A | 9/2013 |

* cited by examiner

*Primary Examiner* — Daborah Chacko-Davis
(74) *Attorney, Agent, or Firm* — Anova Law Group, PLLC

(57) ABSTRACT

A reticle is provided. The reticle comprises a substrate having at least a first region and a second region; and an organic layer aligned in certain directions by an irradiation of a polarized UV light formed on a surface of the substrate. Wherein the organic layer in the first region has a first polarization direction; the organic layer in the second region has a second polarization direction; and the first polarization direction and the second polarization direction have a predetermined angle.

5 Claims, 9 Drawing Sheets

RETICLE AND FABRICATION METHOD THEREOF, AND METHOD FOR FABRICATING PATTERNS ON A SUBSTRATE

CROSS-REFERENCES TO RELATED APPLICATIONS

This application claims the priority of Chinese patent application No. 201510078816.0, filed on Feb. 13, 2015, the entirety of which is incorporated herein by reference.

FIELD OF THE INVENTION

The present invention generally relates to the field of display technology and, more particularly, relates to reticles and fabrication processes thereof, and methods for fabricating patterns on a semiconductor substrate.

BACKGROUND

In a semiconductor manufacturing process, transferring patterns on a reticle to a substrate is an important step. Transferring patterns on a reticle to a substrate includes spin-coating a photoresist layer on the substrate; performing a photolithography process on the photoresist layer to form the corresponding patterns in the photoresist layer; and etching the substrate using the patterned photoresist layer as an etching mask. The exposure light used for the photolithography process is often an ultraviolet (UV) light. The photolithography process is realized by exposing the photoresist layer using an exposure apparatus and a reticle having transparent slits. The transparent slits are corresponding to the patterns. That is, the patterns are formed by the transparent slits. Thus, after the photolithography process, the patterns formed by the transparent slits are transferred to the photoresist layer to form the patterned photoresist layer. After etching the substrate using the patterned photoresist layer as an etching mask, the patterns formed by the slits with certain widths and shapes are formed on the substrate.

Figure 1:
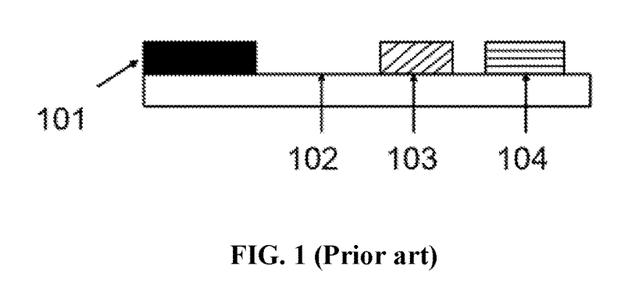
FIG. 1 illustrates an existing half-tone reticle.

The reticle can also be a half-tone reticle. FIG. 1 illustrates an existing half-tone reticle. As shown in FIG. 1, the half-tone reticle includes a substrate (not labeled). The substrate includes an UV light blocking region 101 which entirely blocks the UV light irradiating from the exposure apparatus, and an UV light transparent region 102 which entirely transmits the UV light irradiating from the exposure apparatus. Further, the substrate also includes a plurality of semi-UV transparent regions, such as a first semi-UV light transparent region 103 and a second semi-UV light transparent region 104, etc., which partially transmit the UV light irradiating from the exposure apparatus.

The UV light transmitting through the UV light transparent region and the semi-UV light transparent regions has different exposure intensities. Thus, the patterns formed in the photoresist layer have different thicknesses. Accordingly, after etching the substrate using the patterned photoresist layer as an etching mask, the patterns formed on the substrate have different heights or depths. That is, using the half-tone reticle is able to form patterns with different heights in the substrate by a single exposure process.

Because such an approach is based on the transmittances of the material of the semi-UV light transparent region, if a plurality of semi-UV light transparent regions with different transmittances are needed to be formed on a substrate, it needs a plurality of different materials with different transmittances; and it may also need different fabrication steps. Thus, the fabrication process of a half-tone reticle having more than two different semi-UV light transparent regions with different transmittances are relatively complex. The disclosed device structures and methods are directed to solve one or more problems set forth above and other problems.

BRIEF SUMMARY OF THE DISCLOSURE

One aspect of the present disclosure includes a reticle. The reticle comprises a substrate having at least a first region and a second region; and an organic layer aligned in certain directions by an irradiation of a polarized UV light formed on a surface of the substrate. Wherein the organic layer in the first region has a first polarization direction; the organic layer in the second region has a second polarization direction; and the first polarization direction and the second polarization direction have a predetermined angle.

Another aspect of the present disclosure includes a method for forming a reticle. The method includes providing a substrate having at least a first region and a second region; and forming an organic layer on a surface of the substrate. The method also includes disposing a first patterned mask exposing the first region and blocking the second region above the substrate having the organic layer; and irradiating a polarized UV light to the first patterned mask to align the organic layer in the first region to have a first polarization direction. Further, the method includes rotating the substrate with a first predetermined angle; and disposing a second patterned mask exposing the second region and blocking the first region above the substrate; and irradiating a polarized UV light to second patterned mask to align the organic layer in the second region to have a second polarization direction different from the first polarization direction.

Another aspect of the present disclosure includes a method for forming patterns on a substrate. The method includes providing a substrate having a surface; and forming a photoresist layer on the surface of the substrate. The method also includes providing a metal optical grating and a reticle having at least two regions having different polarization directions, respectively. Further, the method also includes irradiating a regular UV light from a side of the metal optical grating far away from the reticle; and developing the irradiated photoresist layer to form photoresist patterns with different thicknesses on the substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 2A:
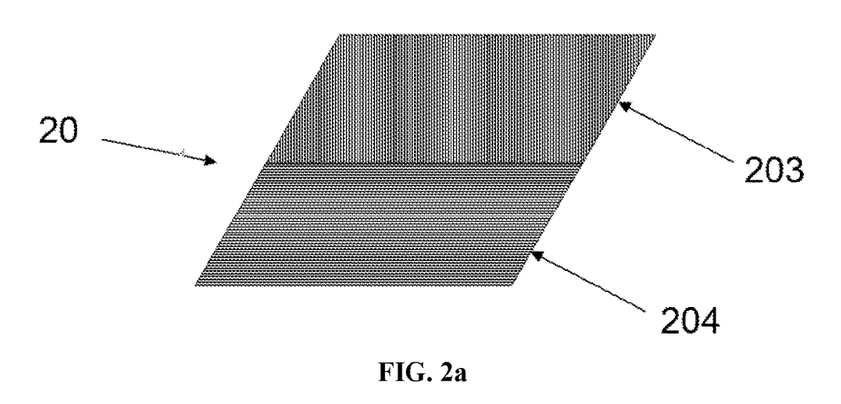
FIG. 2a and FIG. 2b illustrate an exemplary reticle consistent with the disclosed embodiments.
Figure 2B:
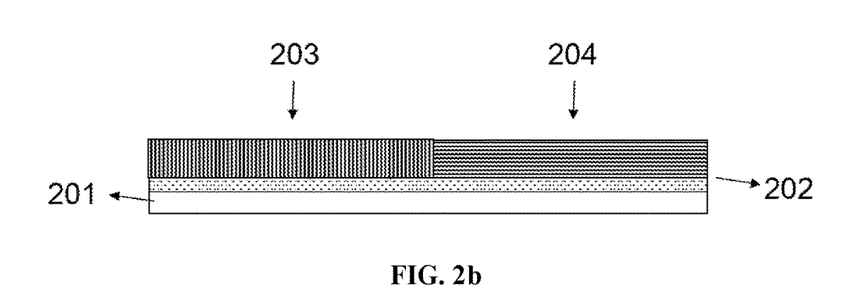

FIG. 2a and FIG. 2b illustrate an exemplary reticle consistent with the disclosed embodiments. FIG. 2a is an oblique view of the reticle illustrated in FIG. 2b.

202 in the first region 203 and the organic layer 202 in the second region 204 may be polarized along different directions.

The substrate 201 may be a transparent substrate; and may be made of any appropriate material, such as quartz, fused silica, glass, or plastic, etc. In one embodiment, the substrate 201 is made of quartz.

The organic layer 202 may be made of any appropriate materials as long as it can be aligned along a certain predetermined direction under a polarized UV light. In one embodiment, the organic layer 202 is made of polyimide doped with a dichroism dye. Under the irradiation of the polarized UV light, the dichroism dye may be aligned in the predetermined direction.

The dichroism dye may need to match some requirements, such as high-dichroism, uniform dyeing property, eximious resistance to heat and humidity; and no change and no sublimation under heating, etc. The dichroism dye may include any appropriate types of dyes. In one embodiment, the dichroism dye may be an azoic dye. The azoic dye may have the eximious resistance to heat and humidity. The azoic dye may include bisazo compounds and trisazo compounds, etc. The bisazo compounds may have a representative formula as shown in structural formula (1); and the trisazo compounds may have a representative formula as shown in structural formula (2).

As shown in FIG. 2a and FIG. 2b, the reticle 20 includes a substrate 201; and an organic layer 202 formed on a surface of the substrate 201. Under an exposure of a polarized UV light, the organic layer 202 may be aligned along a certain direction, i.e., a polarization direction. In one embodiment, as shown in FIG. 2a and FIG. 2b, the reticle 20 may include a first region 203 and a second region 204. The alignment of the organic layer 202 in the first region 203 may have a non-zero angle with the alignment of the organic layer 202 in the second region 204. That is, the organic layer The azoic dye may be modified with any appropriate function groups to achieve different desired functionalities. In one embodiment, electron-donating groups, or electron-withdrawing groups may be introduced to the ends of the molecules of the bisazo compounds; and the liquidity of the bonding electrons in the bisazo compounds may be changed. Accordingly, the absorption intensity and the absorption band may be increased; and the dyeing characteristics of the dichroism dye may be enhanced. A presentative modified bisazo compound is illustrated in structural formula (3).

(3)

The function group R in (3) may have the formula as illustrated in structural formula (4), or the formula as illustrated in structural formula (5).

(4)

(5)

The dichroism dye may also be an anthraquinone dye with a representative formula as illustrated in structural formula (6), a tribenyldioxazine dye and its derivatives with a representative formula as illustrated in structural formula (7), a monomethine dye, or a polymethine dye with a representative formula as illustrated in structural formula (8), etc. The dichroism dye may also be a biphenyl dye, or a polycyclic dye, etc. These dyes may also be doped into polyimide to cause the organic layer 202 made of the doped polyimide to be aligned under the exposure of a polarized UV light.

(6)

(7)

-continued (8)

Further, as shown in FIG. 2a and FIG. 2b, the multiple lines in the first region 203 may refer to the polarization axis of the first region 203. The direction of the polarization axis of the first region 203 may be refereed as a first polarization direction. The multiple lines in the second region 204 may refer to the polarization axis of the second region 204. The direction of the polarization axis of the second region 204 may be referred as a second polarization direction. The first polarization direction and the second polarization direction may have a predetermined angle. In one embodiment, the angle is not equal to zero.

When a polarized UV light with a polarization direction parallel with the first polarization direction of the first region 203 is passing through the reticle 20, the polarized UV light may entirely pass through the first region 203; and the first region 203 may be a transparent region to the polarized UV light. While the second region 204 may block a portion of the polarized UV light; and the second region 204 may be a semi-transparent region to the polarized UV light. When the second polarization direction is perpendicular to the first polarization direction, the polarized UV light may be entirely blocked by the second region 204; and the second region 204 may form a light block region to the polarization UV light. Therefore, different regions of the reticle 20 may have different transmittances to the polarized UV light. That is, the reticle 20 may be used as a half-tone reticle with different transmittances in different regions.

Figure 3:
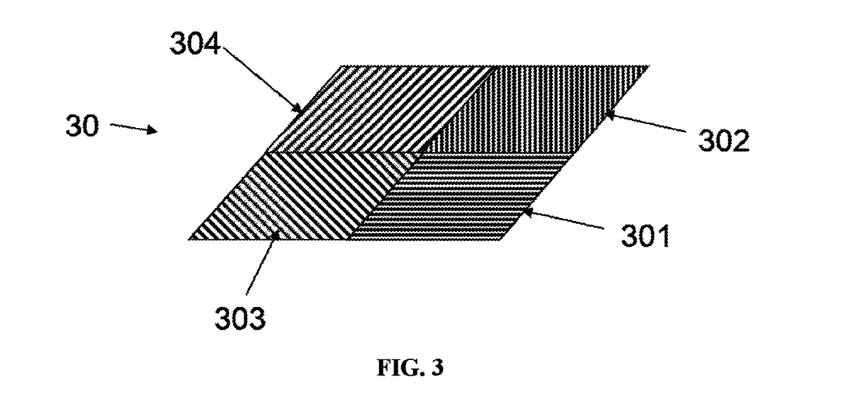
FIG. 3 illustrates another exemplary reticle consistent with the disclosed embodiments.

FIG. 3 illustrates another exemplary reticle consistent with the disclosed embodiments. As shown in FIG. 3, the reticle 30 may include a substrate (not labeled); and an organic layer (not labeled) formed on the substrate. Further, the reticle 30 (or the organic layer) may have a first region 301, a second region 302, a third region 303, and a fourth region 304.

The substrate may be a transparent substrate; and may be made of any appropriate material, such as quartz, fused silica, glass, or plastic, etc. In one embodiment, the substrate is made of quartz.

The organic layer may be made of any appropriate materials as long as it can be aligned along a certain predetermined direction under a polarized UV light. In one embodiment, the organic layer is made of polyimide doped with a dichroism dye.

The dichroism dye may need to match some requirements, such as high-dichroism, uniform dyeing property, eximious resistance to heat and humidity; and no change and no sublimation under heating, etc. The dichroism dye may include any appropriate types of dyes. In one embodiment, the dichroism dye may be an azoic dye. The azoic dye may have the eximious resistance to heat and humidity. The azoic dye may include bisazo compounds and trisazo compounds, etc. The bisazo compounds may have a representative formula as shown in structural formula (1); and the trisazo compounds may have a representative formula as shown in structural formula (2).

The azoic dye may be modified with any appropriate function groups to achieve different desired functionalities. In one embodiment, electron-donating groups, or electron-withdrawing groups may be introduced to the ends of the molecules of the bisazo compounds; and the liquidity of the bonding electrons of the azoic dye may be changed. Accordingly, the absorption intensity and the absorption band may be increased; and the dyeing characteristics of the dichroism dye may be enhanced. A presentative modified bisazo compound is illustrated in (3). The function group R in structural formula (3) may have the formula as illustrated in structural formula (4), or the formula as illustrated in structural formula (5).

The dichroism dye may also be an anthraquinone dye with a representative formula as illustrated in structural formula (6), a tribenyldioxazine dye and its derivatives with a representative formula as illustrated in structural formula (7), a monomethine dye, or a polymethine dye with a representative formula as illustrated in structural formula (8), etc. The dichroism dye may also be a biphenyl dye, or a polycyclic dye, etc. These dyes may also be doped into the polyimide to cause the organic layer made of the doped polyimide to be aligned under the exposure of a polarized UV light.

Further, as shown in FIG. 3, the multiple lines in the first region 301 may refer to polarization axis of the first region 301; and the direction of the polarization axis may be referred as a first polarization direction. The multiple lines in the second region 302 may refer to polarization axis of the second region 302; and a direction of the polarization axis may be referred a second polarization direction. The multiple lines in the third region 303 may refer to polarization axis of the third region 303; and a direction of the polarization axis may be referred a third polarization direction. The multiple lines in the fourth region 304 may refer to polarization axis of the fourth region 304; and a direction of the polarization axis may be referred a fourth polarization direction.

In one embodiment, the first polarization direction may be perpendicular to the second polarization direction. The third polarization direction may have predetermined angles with the first polarization direction and the second polarization direction, respectively. The fourth polarization direction may have predetermined angles with the first polarization direction, the second polarization direction, and the third polarization direction, respectively. The angles may not be equal to zero.

When a polarized UV light with a polarization direction parallel to the first polarization direction is irradiating the reticle 30, the portion of the polarized UV light irradiating the first region 301 may entirely pass through the first region 301; and a transparent region of the polarized UV light may be formed. The portion of the polarized UV light irradiating the second region 302 may be entirely blocked; and a light blocking region may be formed. The portion of the polarized UV light irradiating the third region 303 may partially pass through the third region 303; and a first semi-transparent region may be formed. The portion of the polarized UV light irradiating the fourth region 304 may also partially pass through the fourth region 304; and a second semi-transparent region may be formed. The intensity of the polarized UV light passing through the fourth region 304 may be different from the intensity of the UV light passing through the third region 303. Thus, by controlling the intensity of the polarized UV light passing through the reticle 30 having different regions with different polarization directions, the transmittance of each region may be adjustable, and the light intensity of the polarized UV light passing through each region may be adjustable; and may be different. Accordingly, the reticle 30 may be a half-tone mask; and may be used to form patterns with different thickness by a single exposure step.

Figure 4:
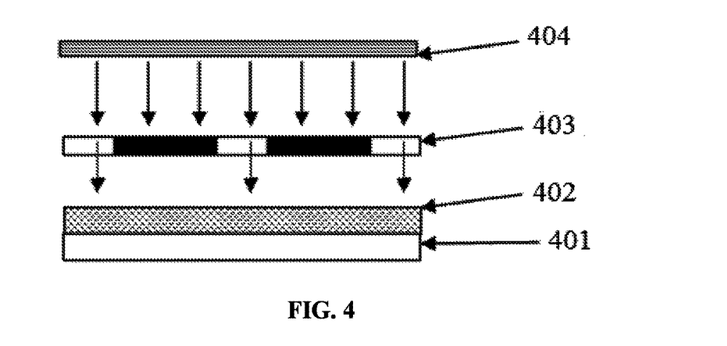
FIG. 4 illustrates a schematic corresponding certain stages of an exemplary fabrication process of a reticle consistent with the disclosed embodiments.
Figure 4A:
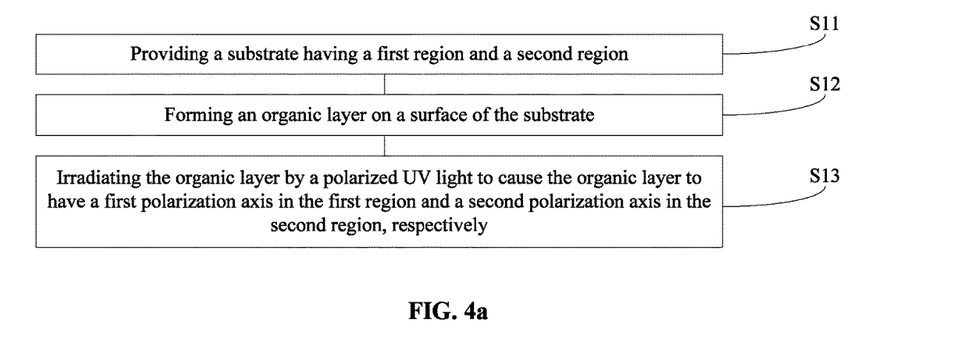
FIG. 4a illustrates an exemplary fabrication process of a reticle consistent with the disclosed embodiments.

FIG. 4a illustrates an exemplary fabrication process of a reticle consistent with the disclosed embodiments. FIG. 4 illustrates a schematic corresponding to certain stages of the exemplary fabrication process.

As shown in FIG. 4a, at the beginning of the fabrication process, a substrate is provided (S11). FIG. 4 illustrates a corresponding schematic.

As shown in FIG. 4, a substrate 401 is provided. The substrate 401 may be a transparent substrate; and may be made of any appropriate materials, such as quartz, fused silica, glass, or plastic, etc. In one embodiment, the substrate 401 is made of quartz. The substrate 401 provides a base for subsequent devices and processes.

Returning to FIG. 4a, after providing the substrate 401, an organic layer may be formed (S12). FIG. 4 also illustrates a corresponding schematic.

As shown in FIG. 4, an organic layer 402 is formed on a surface of the substrate 401. The organic layer 402 may be made of any appropriate materials as long as it can be aligned along a certain predetermined direction under a polarized UV light. In one embodiment, the organic layer 402 is made of polyimide doped with a dichroism dye.

The dichroism dye may need to match certain requirements, such as high-dichroism, uniform dyeing property, eximious resistance to heat and humidity; and no change and no sublimation under heating, etc. The dichroism dye may include any appropriate types of dyes. In one embodiment, the dichroism dye may be an azoic dye. The azoic dye may have the eximious resistance to heat and humidity. The azoic dye may include bisazo compounds and trisazo compounds, etc. The bisazo compounds may have a representative formula as shown in structural formula (1); and the trisazo compounds may have a representative formula as shown in structural formula (2).

The azoic dye may be modified with any appropriate function groups to achieve different desired functionalities. In one embodiment, electron-donating groups, or electron-withdrawing groups may be introduced to the ends of the molecules of the bisazo compounds; and the liquidity of the bonding electrons of the azoic dye may be changed. Accordingly, the absorption intensity and the absorption band may be increased; and the dyeing characteristics of the dichroism dye may be enhanced. A presentative modified bisazo compound is illustrated in structural formula (3). The function group R in structural formula (3) may have the formula as illustrated in structural formula (4), or the formula as illustrated in structural formula (5).

The dichroism dye may also be an anthraquinone dye with a representative formula as illustrated in structural formula (6), a tribenyldioxazine dye and its derivatives with a representative formula as illustrated in structural formula (7), a monomethine dye, or a polymethine dye with a representative formula as illustrated in structural formula (8), etc. The dichroism dye may also be a biphenyl dye, or a polycyclic dye, etc. These dyes may also be doped into polyimide to cause the organic layer 301a made of the doped polyimide to be aligned under the exposure of a polarized UV light.

Various processes may be used to forming the organic layer 402, such as a spin-coating process, a dip-coating process, or an electro-spraying process, etc. Specifically, a precursor including polyimide and a dichroism dye may be coated on the surface of substrate 401; and followed by certain drying processes.

Returning to FIG. 4a, after forming the organic layer 402, the organic layer 402 may be irritated by a polarized UV light (S13). FIG. 4 also illustrates a corresponding schematic.

As shown in FIG. 4, the organic layer 402 is irradiated by a polarized UV light; and the dyes of the organic layer 402 may be aligned with a predetermined direction. That is, the organic layer 402 may be polarized. The polarized UV light may be generated by filtering a regular or un-polarized UV light 404 with a metal optical grating 403 with predetermined directions. The optical grating 403 may have different regions; and the directions of the slits in different regions may be different. The slits in the metal optical grating 403 may be corresponding to the polarization axis of the polarized UV light. Accordingly, the polarization axis of each region of the irradiated organic layer 402 may be corresponding to the polarization axis of the polarized UV light irradiating the corresponding region; and the polarization direction of each region of the irradiated organic layer 402 may be corresponding to the polarization direction of the polarize UV light irradiating the corresponding region.

Specifically, the organic layer 402 may be pre-baked firstly. The pre-baking temperature may be in a range of approximately 10° C.~30° C. Then, the pre-baked organic layer 402 may be irradiated by the polarized UV light. The dichroism organic dye may be aligned in polyimide with the predetermined directions in different regions. The alignment direction of the dichroism dye in one region may be referred as the polarization direction of this region. The alignment direction of the dichroism dye may be corresponding to the direction of the slits of the optical grating. The power of the irradiating polarized UV light may be in a range of approximately 800 mJ~1000 mJ.

After irradiating the pre-baked organic layer 402, the irradiated organic layer 402 may be post-baked, and then cured. The post-baking temperature may be in a range of approximately 90° C.~130° C.; and the post-baking time may be in a range of approximately 90 s~120 s. The curing temperature may be in a range of approximately 210° C.~230° C.; and the curing time may be in a range of approximately 20 mins~50 mins. In one embodiment, the post-baking temperature is approximately 130° C.; the post-baking time is approximately 120 s; the curing temperature is approximately 230°; and the curing time is approximately 30 mins.

Figure 5A:
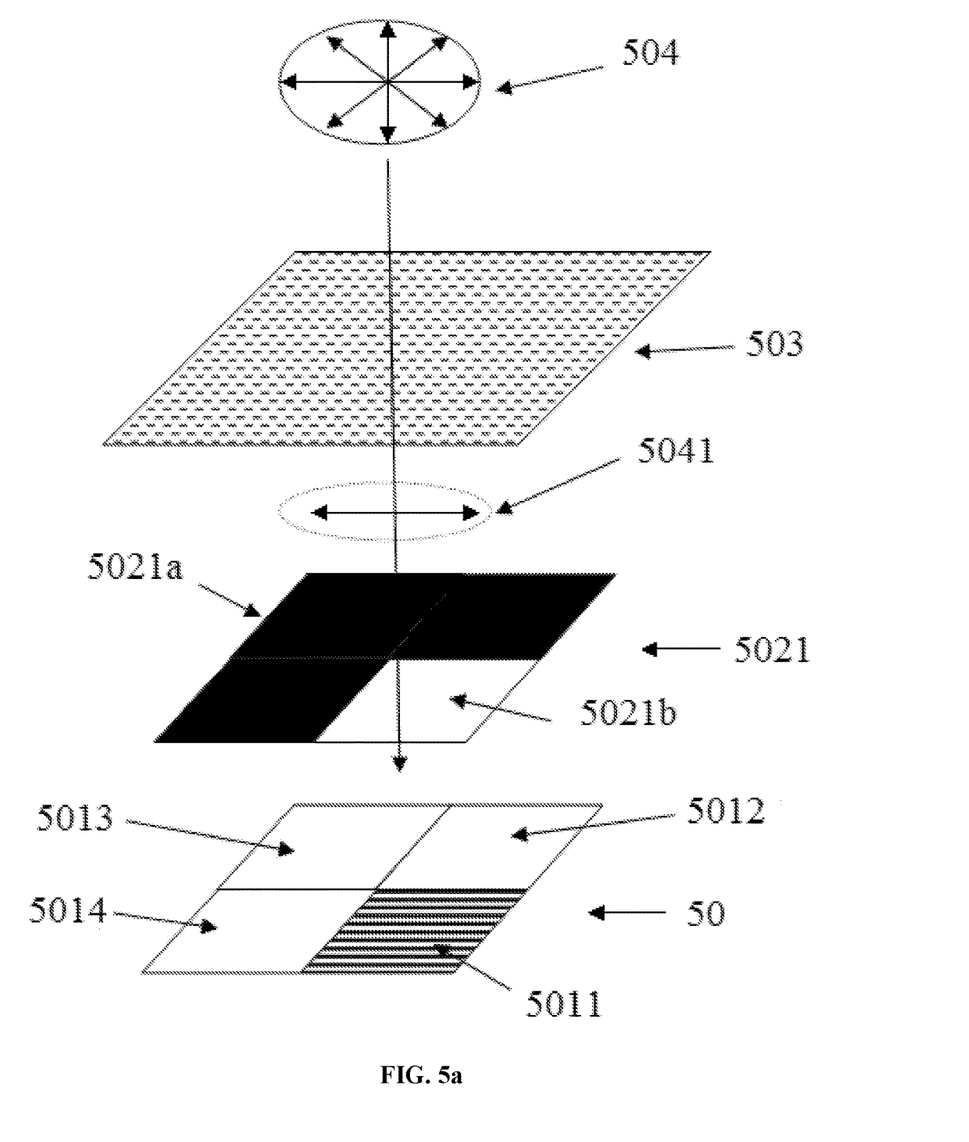
FIGS. 5a-5d illustrate schematics corresponding to certain stages of another exemplary fabrication of a reticle consistent with the disclosed embodiments.
Figure 5B:
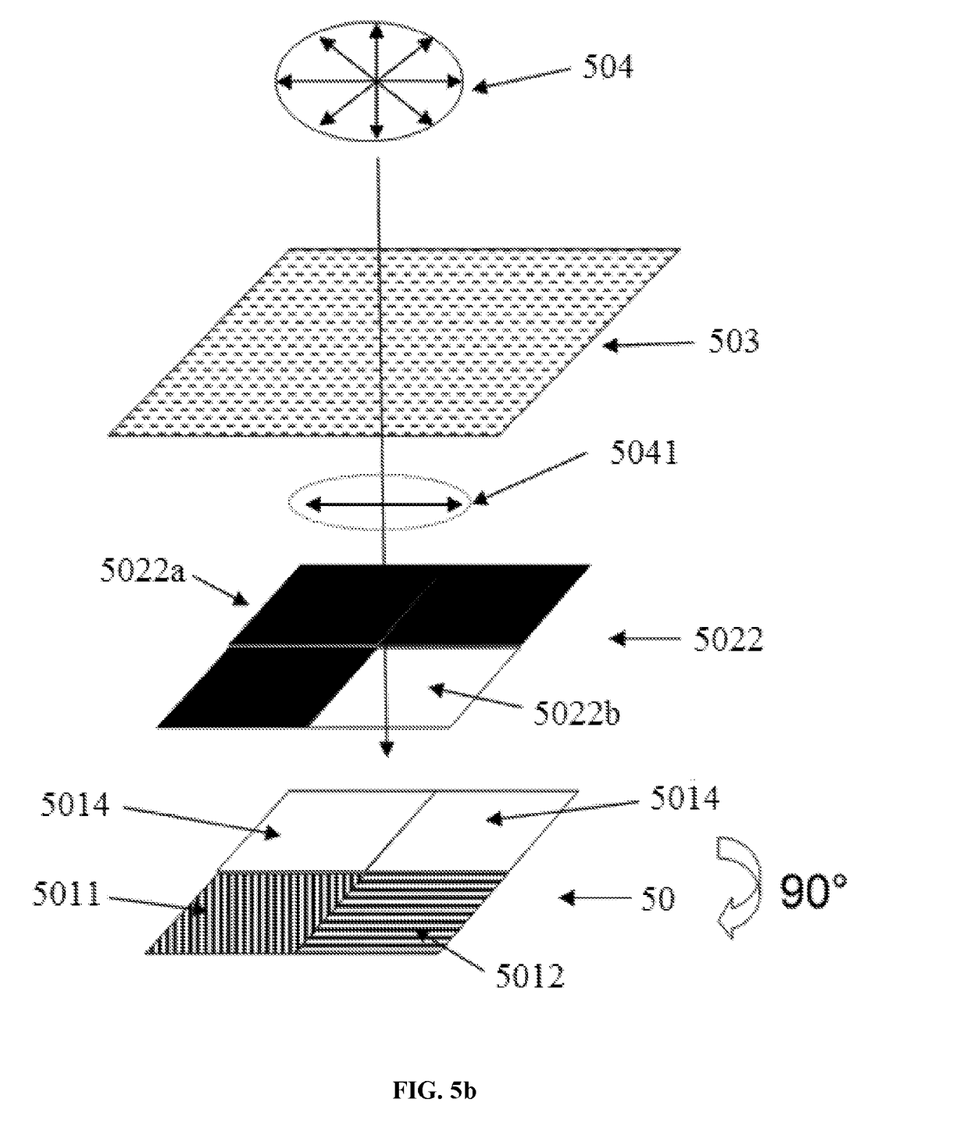
Figure 5C:
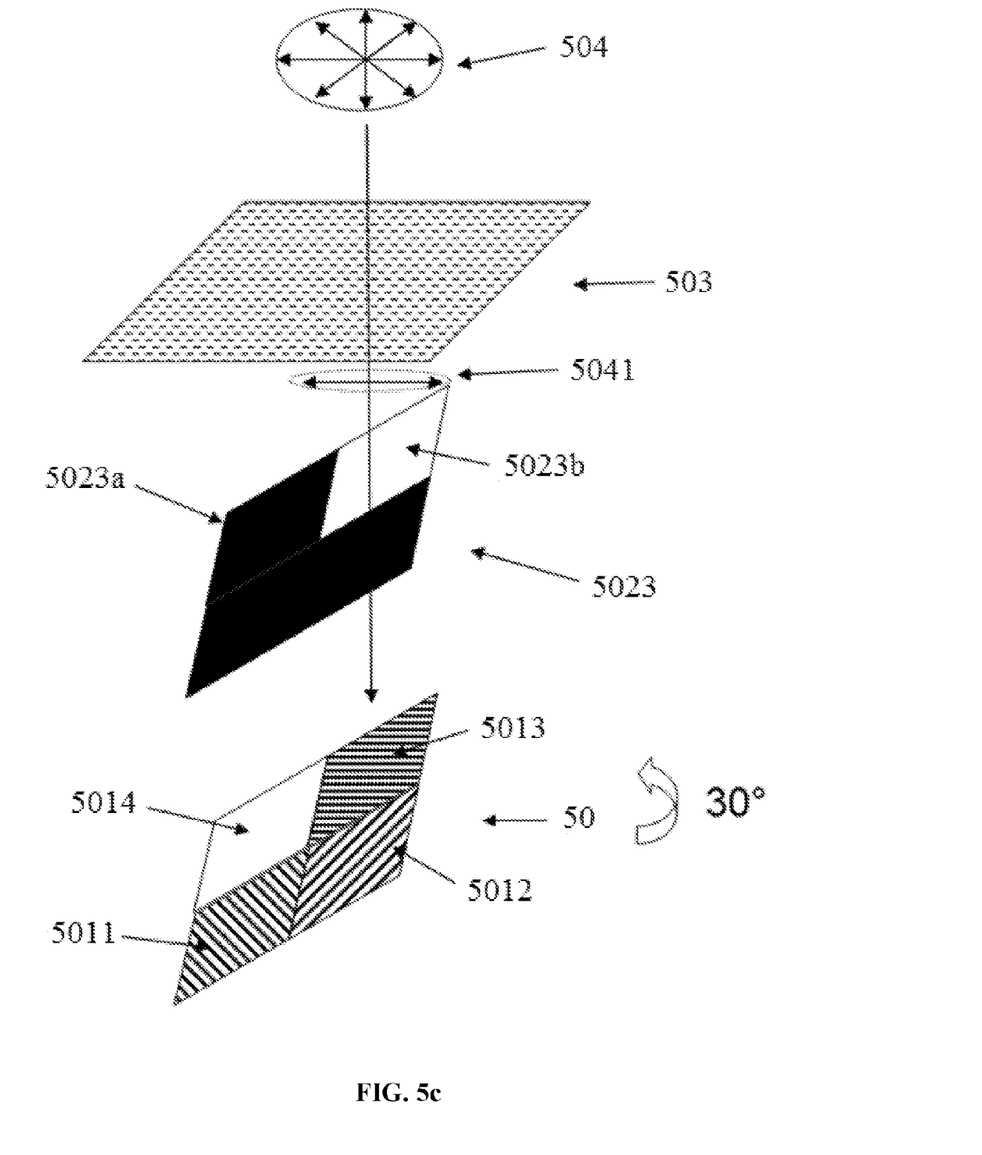
Figure 5D:
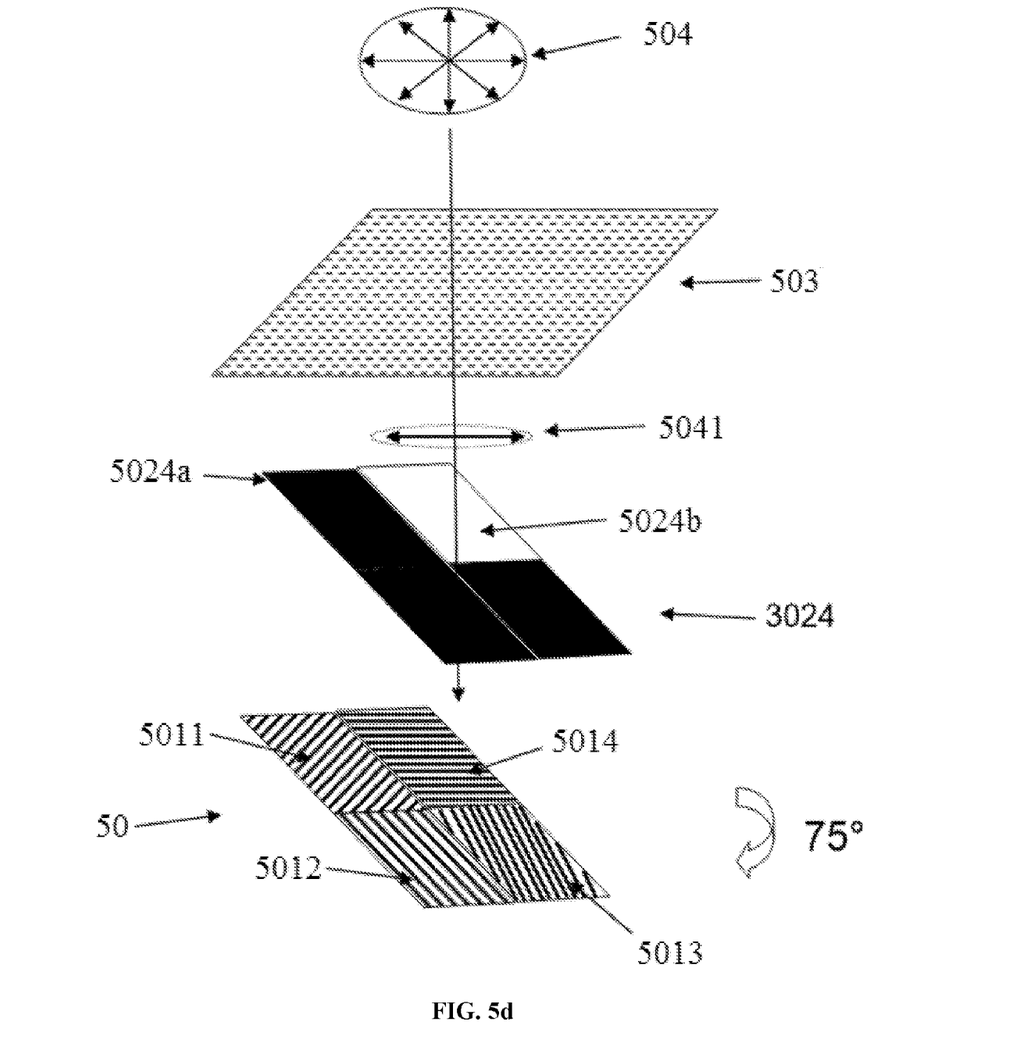
Figure 6:
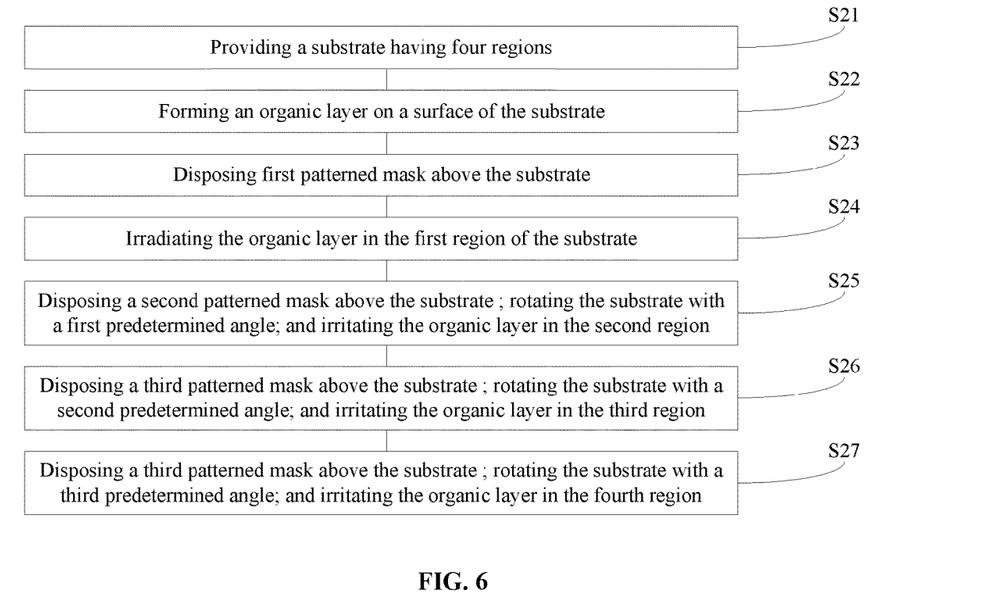
FIG. 6 illustrates another exemplary fabrication process of a reticle consistent with the disclosed embodiments.

FIG. 6 illustrates another exemplary fabrication process of a reticle consistent with the disclosed embodiments. FIGS. 5a~5d illustrate schematics corresponding the certain stages of the exemplary fabrication process.

As shown in FIG. 6, at the beginning of the fabrication process of a reticle 50, a substrate is provided (S21). FIG. 5a illustrates a corresponding structure.

As shown in FIG. 5a, a substrate (not labeled) is provided. The substrate may be a transparent substrate; and may be made of any appropriate materials, such as quartz, fused silica, glass, or plastic, etc. In one embodiment, the substrate is made of quartz. The substrate provides a base for subsequent devices and processes.

Returning to FIG. 6, after providing the substrate, an organic layer may be formed (S22). FIG. 5a also illustrates a corresponding schematic.

As shown in FIG. 5a, an organic layer (not labeled) is formed on a surface of the substrate. The organic layer may be made of any appropriate materials as long as it can be aligned along a certain predetermined direction under an exposure of a polarized UV light. In one embodiment, the organic layer is made of polyimide doped with a dichroism dye.

The dichroism dye may need to match certain requirements, such as high-dichroism, uniform dyeing property, eximious resistance to heat and humidity; and no change and no sublimation under heating, etc. The dichroism dye may include any appropriate types of dyes. In one embodiment, the dichroism dye may be an azoic dye. The azoic dye may have the eximious resistance to heat and humidity. The azoic dye may include bisazo compounds and trisazo compounds, etc. The bisazo compounds may have a representative formula as shown in structural formula (1); and the trisazo compounds may have a representative formula as shown in structural formula (2).

The azoic dye may be modified with any appropriate function groups to achieve different desired functionalities. In one embodiment, electron-donating groups, or electron-withdrawing groups may be introduced to the ends of the molecules of the bisazo compounds; and the liquidity of the bonding electrons of the azoic dye may be changed. Accordingly, the absorption intensity and the absorption band may be increased; and the dyeing characteristics of the dichroism dye may be enhanced. A presentative modified bisazo compound is illustrated in structural formula (3). The function group R in structural formula (3) may have the formula as illustrated in structural formula (4), or the formula as illustrated in structural formula (5).

The dichroism dye may also be an anthraquinone dye with a representative formula as illustrated in structural formula (6), a tribenyldioxazine dye and its derivatives with a representative formula as illustrated in structural formula (7), a monomethine dye, or a polymethine dye with a representative formula as illustrated in (8), etc. The dichroism dye may also be a biphenyl dye, or a polycyclic dye, etc. These dyes may also be doped into polyimide to cause the organic layer made of the doped polyimide to be aligned under the exposure of a polarized UV light. Various processes may be used to form the organic layer, such as a spin-coating process, a dip-coating process, or an electro-spraying process, etc.

The organic layer (or the substrate) may be divided into four regions: a first region 5011, a second region 5012, a third region 5013, and a fourth region 5014. The four regions may also be corresponding to four regions of the reticle 50.

Returning to FIG. 6, after forming the organic layer, a first patterned mask and a metal grating may be provided (S23). FIG. 5a also illustrates a corresponding schematic.

As shown in FIG. 5a, a first patterned mask 5021 is provided; and the first patterned mask 5021 may be disposed above the substrate having the organic layer. Further, a metal optical grating 503 may be provided; and may be disposed above the first patterned mask 5021.

The first patterned mask 5021 may have a transparent region 5021a, i.e. where light may entirely pass through; and a light blocking region 5021b, i.e., where light may be entirely blocked. The first patterned mask 5021 may be formed by deposing a patterned metal layer on a transparent substrate.

The metal optical grating 503 may be used to generate a polarized UV light 5041 from a regular UV light 504. That is, a portion of the regular UV light 504 passing through the metal optical grating 5021 may become the polarized UV light 5041. The metal optical grating 503 may be made of any appropriate material, such as Mo, Al, or an alloy of Mo and Al, etc.

Returning to FIG. 6, after providing the first patterned mask 5021 and the metal optical grating 503, the first region 5011 may be irradiated (S24). FIG. 5a also illustrates a corresponding schematic.

Specifically, the transparent region 5021b of the first patterned mask 5021 may be aligned with the first region 5011 of the reticle 50. The regular UV light 504 may irradiate the metal optical grating 503; and the portion of the regular UV light 504 passing through the metal optical grating 503 may form the polarized UV light 5041. The polarized UV light 5041 may irradiate the first region 5011 of the substrate. The organic film in the first region 5011 may be aligned along a predetermined direction under the irradiation of the polarized UV light 5041. The direction may be parallel to the polarization direction of the polarized UV light 5041. The direction may be the direction of the polarization axis of the first region 5011; and the polarization direction of the first region 5011 may be referred as a first polarization direction.

Before irradiating the organic layer, the organic layer may be pre-baked firstly. The pre-baking temperature may be in a range of approximately 10° C.~30° C.

Returning to FIG. 6, after irradiating the first region 5011, a second patterned mask may be provided; and the second region 5012 may be irradiated (S25). FIG. 5b illustrates a corresponding schematic.

As shown in FIG. 5b, a second patterned mask 5022 is provided; and the substrate with the organic layer may be clock-wise rotated by a first predetermined angle. In one embodiment, the first predetermined angle is approximately 90°. The second patterned mask 5022 may have a transparent region 5022b and a light blocking region 5022a. The transparent region 5022b may be aligned with the second region 5012 of the substrate.

The regular UV light 504 may irradiate the metal optical grating 503; and the portion of the regular UV light 504 passing through the metal optical grating 503 may form the polarized UV light 5041. The polarized UV light 5041 may irradiate the second region 5012 of the substrate. The organic film in the second region 5012 may be aligned in a certain predetermined direction under the irradiation of the polarized UV light 5041. The direction may be parallel to the polarization direction of the polarized UV light 5041. The direction may be the direction of the polarization axis of the second region 5012; and the polarization direction of the second region may be referred as a second polarization direction. Because the substrate is rotated by 90°, the second polarization direction may be perpendicular to the first polarization direction. That is, the first polarization direction and the second polarization direction may have an angle. In one embodiment, the angle may be approximately 90°.

Returning to FIG. 6, after irradiating the second region 5012, a third patterned mask may be provided; and the third region 5013 may be irradiated (S26). FIG. 5c illustrates a corresponding schematic.

As shown in FIG. 5c, a third patterned mask 5023 is provided; and the substrate with the organic layer may be counter clock-wise rotated with a second predetermined angle. In one embodiment, the second predetermined angle is approximately 30°. The third patterned mask 5023 may have a transparent region 5023b and a light blocking region 5023a. The transparent region 5023b may be aligned with the third region 5013 of the substrate.

The regular UV light 504 may irradiate the metal optical grating 503; and the portion of the regular UV light 504 passing through the metal optical grating 503 may generate the polarized UV light 5041. The polarized UV light 5041 may irradiate the third region 5013 of the substrate. The organic film in the third region 5013 may be aligned in a certain direction under the irradiation of the polarized UV light 5041. The direction may be parallel to the polarization direction of the polarized UV light 5041. The direction may be the polarization direction of the third region 5013; and the polarization direction of the third region 5013 may be referred as a third polarization direction. Because the substrate is counter clockwise rotated by 30°, the third polarization direction and the second polarization direction may have an angle. In one embodiment, the angle may be approximately 30°.

Returning to FIG. 6, after irradiating the third region 5013, a fourth patterned mask may be provided; and the fourth region 5014 may be irradiated (S27). FIG. 5d illustrates a corresponding schematic.

As shown in FIG. 5d, a fourth patterned mask 5024 is provided; and the substrate with the organic layer may be clock-wise rotated by a third predetermined angle. In one embodiment, the third predetermined angle is approximately 75°. The fourth patterned mask 5024 may have a transparent region 5024b and a light-blocking region 5024a. The transparent region 5024b may be aligned with the fourth region 5014 of the substrate.

The regular UV light 504 may irradiate the metal optical grating 503; and the portion of the regular UV light 504 passing through the metal optical grating 503 may generate the polarized UV light 5041. The polarized UV light 5041 may irradiate the fourth region 5014 of the substrate. The organic film in the fourth region 5014 may be aligned in a certain direction under the irradiation of the polarized UV light 5041. The direction may be parallel to the polarization direction of the polarized UV light 5041. The direction may be the direction of the polarization axis of the fourth region 5014; and the polarization direction of the fourth region 5014 may be referred as a fourth polarization direction. Because the substrate is clock-wise rotated by 75°, the fourth polarization direction and the third polarization direction may have an angle. In one embodiment, the angle may be approximately 75°.

After irradiating all the four regions of the pre-baked organic layer, the irradiated organic layer may be post-baked, and then cured. The post-baking temperature may be in a range of approximately 90° C.~130° C.; and the post-baking time may be in a range of approximately 90 s–120 s. The curing temperature may be in a range of approximately 210° C.~230° C.; and the curing time may be in a range of approximately 20 mins-50 mins. In one embodiment, the post-baking temperature is approximately 130° C.; the post-baking time is approximately 120 s; the curing temperature is approximately 230°; and the curing time is approximately 30 mins.

Figure 7:
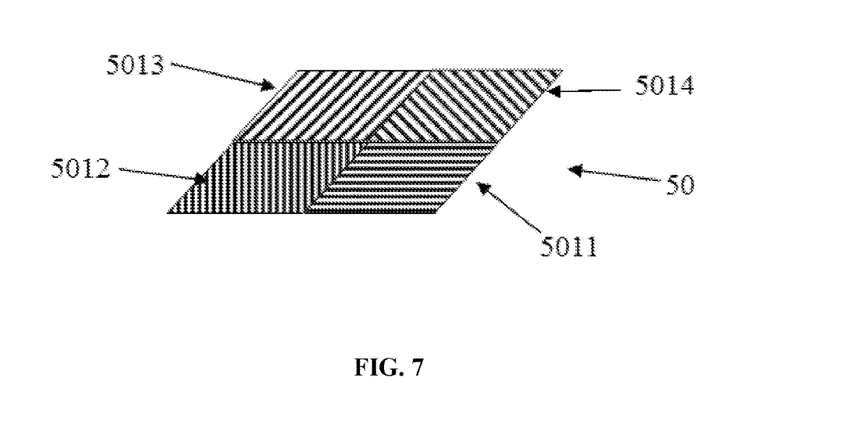
FIG. 7 illustrates an exemplary reticle formed by the exemplary fabrication process illustrated in FIG. 6.

Thus, the reticle 50 having four regions may be formed. FIG. 7 illustrates the corresponding reticle. If the first polarization direction of the first region 5011 is defined as 0°, the second polarization direction of the second region 5012 may be at 90°; the third polarization direction of the third region 5013 may be at 30°; and the fourth polarization direction 5014 may be at 135°. When the reticle 50 is used together with a polarized UV light, the reticle 50 may have four different transmittances in the four different regions.

Referring to FIG. 5a~5d, the polarized UV light may precisely control the alignment direction of the organic layer, i.e., the polarization direction. That is, the polarized UV light may precisely control the direction of the polarization axis of each region. The directions of the polarization axis in different regions may not affect each other.

Figure 8:
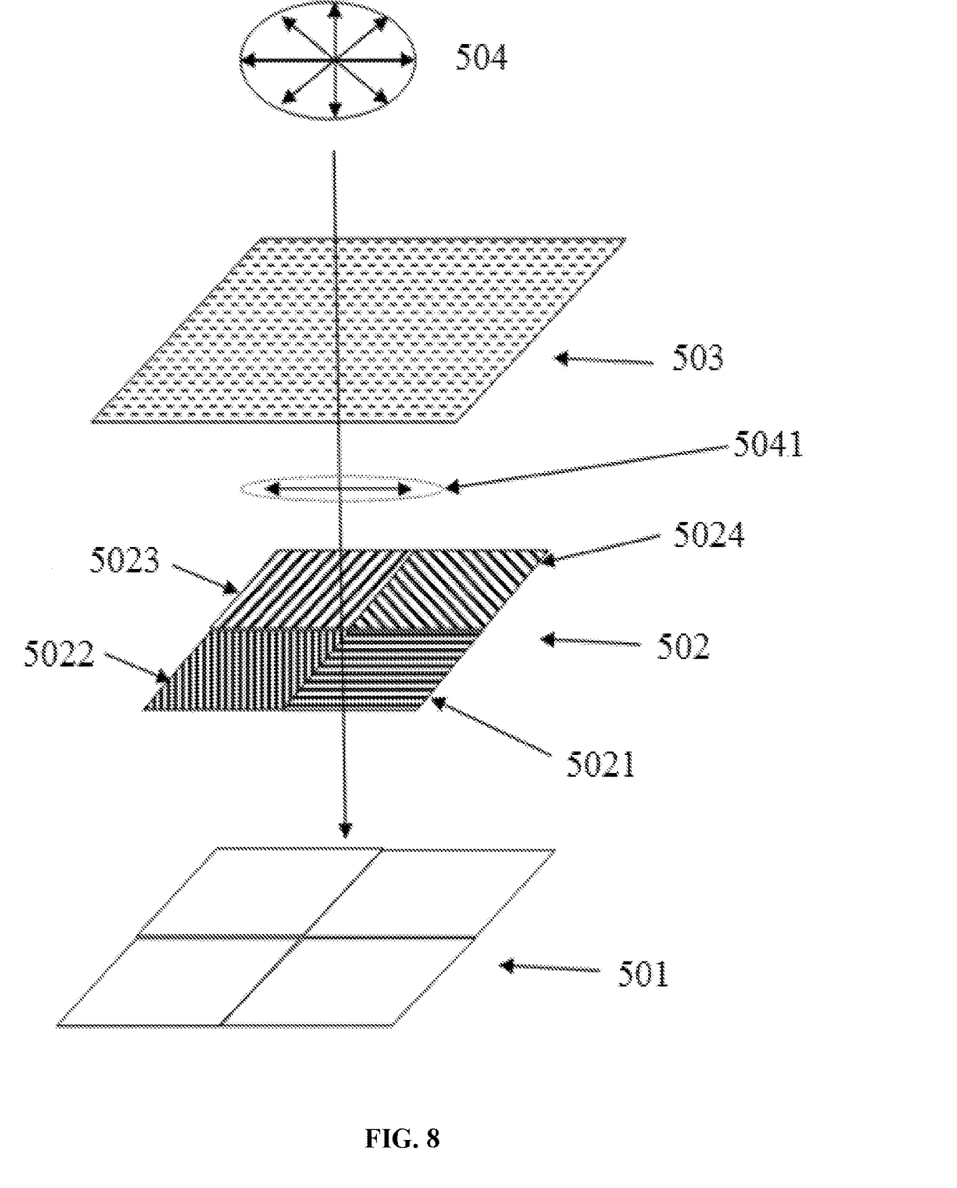
FIG. 8 illustrates an exemplary schematic corresponding stages of a process for forming patterns on a substrate consistent with the disclosed embodiments.
Figure 10:
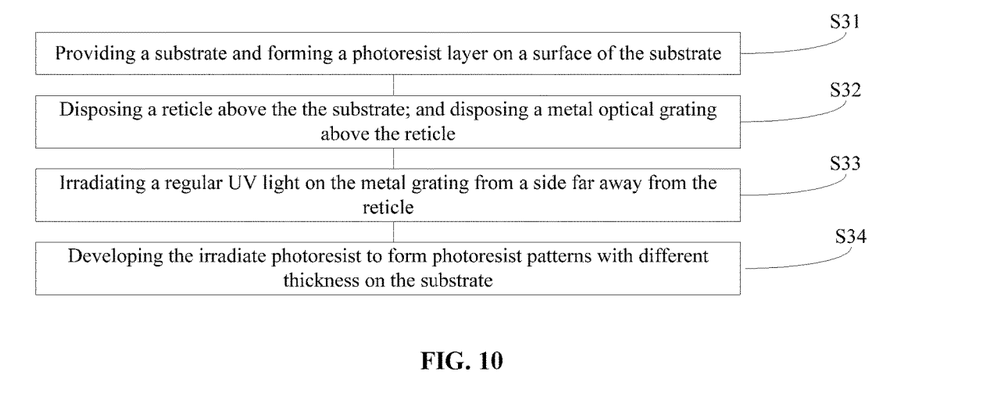
FIG. 10 illustrates an exemplary process for forming patterns on a substrate consistent with the disclosed embodiments.

FIG. 10 illustrates an exemplary process for forming patterns on a substrate using the disclosed reticle consistent with the disclosed embodiment. FIG. 8 illustrates a corresponding schematic of the exemplary fabrication process.

As shown in FIG. 10, at the beginning of the fabrication process, a substrate with certain structures is provided (S31). FIG. 8 illustrates a corresponding schematic.

As shown in FIG. 8, a substrate 501 is provided; and a photoresist layer (not labeled) is formed on the substrate 501. The substrate 501 may be made of any appropriate materials; and certain structures may be formed in and/or on the substrate 501. The semiconductor substrate 501 provides a base for subsequent devices and processes. The photoresist layer may be formed on a surface of the substrate 501 by a spin-coating process, etc.

Returning to FIG. 10, after providing the substrate 501, a reticle and a metal optical grating may be provided (S32). FIG. 8 also illustrates a corresponding schematic.

As shown in FIG. 8, a reticle 502 is provided; and the reticle 502 may be disposed above the substrate 501 with the photoresist layer. Further, a metal optical grating 503 is provided; and the metal optical grating 503 may be disposed above the reticle 502.

In one embodiment, the reticle 502 may have four different regions; each of the four different regions may have a polarized organic layer with a predetermined polarization direction. Specifically, the reticle 502 may have a first region 5021; and a direction of the polarization axis, i.e., polarization direction, of the first region 5021 may be defined as zero for a certain polarized UV light. The reticle 502 may also have a second region 5022; and a direction of the polarization axis of the second region 5022 may be at 90° to the certain polarized UV light. The reticle 502 may also have a third region 5023; and a direction of the polarization axis of the third region 5023 may be at 30° to the certain polarized UV light. The reticle 502 may also have a fourth region 5024; and a direction of the polarization axis of the fourth region 5024 may be at 135° to the certain polarized UV light.

Returning to FIG. 10, after providing the reticle 502 and the metal optical grating 503, an regular UV light may irradiate the metal optical grating 503 from the side far away from the reticle 502 (S33). FIG. 8 also illustrates a corresponding schematic.

As shown in FIG. 8, a regular UV light 504 irradiates the metal optical grating 503 from the side far away from the reticle 502. The portion of the regular UV light passing through the metal optical grating 503 may form a polarized UV light 5041. When the polarized UV light 5041 passes through the four regions of the reticle 502, the polarized UV light irritating the substrate 501 may have four different intensities.

Figure 9:
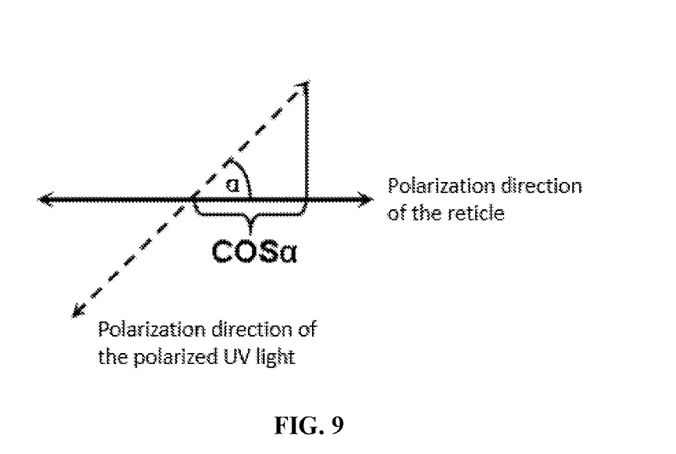
FIG. 9 illustrates a relationship of the intensities of a polarized UV light before and after passing through a reticle consistent with the disclosed embodiments.

Specifically, as shown in FIG. 9, when the polarization direction of the metal optical grating 503 and the polarization direction of a region of the reticle 502 have an angle "α", the intensity of the polarized UV light 5041 passing through the region may be equal to (cos α) of the intensity of the polarized UV light 5041 before passing through the region. In one embodiment, the polarization direction of the first region 5021 may be parallel to the polarization direction of the metal optical grating 503. Thus, "α" is equal to zero. Therefore, the polarized UV light 5041 irradiating the first region 5021 may entirely pass through the first region 5021; and the first region 5021 may be referred as an UV transparent region. For the second region 5022, "α" is equal to approximately 90°. Thus, the polarized UV light 5041 may be entirely blocked by the second region 5022; and the second region 5022 may be referred as a light blocking region. For the third region 5023, "α" is equal to approximately 30°. Thus, 86.6% of the polarized UV light 5041 irradiating the third region 5023 may pass through the third region 5023; and the third region 5023 may be referred as a first semi-transparent region. For the fourth region 5024, "α" is equal to approximately 135°. Thus, 70.7% of the polarized UV light 5041 irradiating the fourth region 5024 may pass through the fourth region 5024; and the fourth region 5024 may be referred as a second semi-transparent region.

Accordingly, the photoresist layer may be exposed by a polarized UV light with four different intensities. That is, the photoresist layer may have four regions exposed by four different doses. The exposed depths of the photoresist layer in different regions may be different.

Returning to FIG. 10, after irradiating the photoresist layer, the photoresist layer may be developed (S34). That is, the exposed portions of the photoresist layer may be removed. Thus, photoresist patterns with different thickness may be formed on the surface of the substrate 401.

After forming the substrate 501 having the photoresist patterns with different thickness, an etching process may be performed to form patterns on the substrate 501. Because the photoresist patterns may have different thickness, the etching process may etch the portion of the substrate 501 having the photoresist pattern with the smallest thickness first; and etch the portion of the substrate 501 having the photoresist pattern with the largest thickness last. Thus, the patterns formed in the substrate 501 may have different depths, or different heights. By using the disclosed reticle 502, i.e., a half-tone reticle, such patterns may be formed by a single photolithography process, the process step may be simplified, and the production cost may be reduced.

The method for forming patterns on the substrate 501 may also be used to form large size displays and cellular phone displays, including LCD display, or OLED display, etc. Especially, the method may be used to form display panels. For example, in a display panel with 1920*1080 pixels, the disclosed reticle may be used to form devices with different patterns and thicknesses. In certain other embodiments, the reticle having a plurality of regions with different transmittances may be designed according to specific requirements.

According to the disclosed structures and methods, the reticle may include the organic layer with different regions. Different regions may have different polarization direction. By controlling the intensity of an UV light passing through the different regions with different polarization axis, the transmittances of the reticle in different regions may be adjustable. Accordingly, the photoresist layer exposed by using such a reticle may receive different exposing doses in different regions; and photoresist patterns with different thicknesses may be formed. The disclosed structure and methods may be used in LCD displays, OLED displays, and may be used in the fabrication of such devices.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A reticle, comprising:
a base substrate having at least a first region and a second region coplanar disposed; and
a single organic layer formed on an entire surface of the base substrate, wherein the single organic layer is aligned in certain directions by an irradiation of a polarized UV light,
wherein:
the single organic layer in the first region has a first polarization direction;
the single organic layer in the second region has a second polarization direction;
the first polarization direction and the second polarization direction have a predetermined non-zero angle,
in the entire first region, the reticle is configured to entirely pass a first polarized UV light incident onto the first region, and block at least a portion of a second polarized UV light incident onto the first region, wherein the first polarized UV light has a polarization direction parallel to the first polarization direction, and the second polarized UV light has a polarization direction parallel to the second polarization direction, and
in the entire second region, the reticle is configured to entirely pass the second polarized UV light incident onto the second region, and block at least a portion of the first polarized UV light incident onto the second region,
such that when UV light is irradiated on a substrate coated with a photoresist layer through the reticle, photoresist patterns having at least two different depths are formed on the substrate through a single photolithography process,
wherein:
the organic layer is a polyimide layer doped with a dichroism dye,
the dichroism dye includes one of a bisazo compound and a trisazo compound,
the bisazo compound includes an electron-donating group or an electron-withdrawing group at ends of molecules of the bisazo compound,
the bisazo compound has a structural formula (I), the structural formula (I) being:

and
a function group R in the structural formula (I) has a structural formula (II) or a structural formula (III),
the structural formula (II) being:

and the structural formula (III) being:

2. The reticle according to claim 1, wherein:
the first polarization direction is perpendicular to the second polarization direction.
3. The reticle according to claim 2, further comprising:
a third region, the organic layer in which has a third polarization direction having predetermined angles with the first polarization direction and the second polarization direction, respectively.
4. The reticle according to claim 3, further comprising:
a fourth region, the organic layer in which has a fourth polarization direction having predetermined angles with the first polarization direction, the second polarization direction, and the third polarization direction, respectively.
5. The reticle according to claim 1, wherein:
the base substrate is a quartz substrate.

* * * * *